(12) United States Patent
Pezzutti et al.

(10) Patent No.: US 8,698,405 B2
(45) Date of Patent: Apr. 15, 2014

(54) USER INTERFACE WITH CIRCULAR LIGHT GUIDED RING WITH ADAPTIVE APPEARANCE DEPENDING ON FUNCTION

(75) Inventors: Daniel K. Pezzutti, Eindhoven (NL); Ramon E. F. Van De Ven, Eindhoven (NL); Ay L. De Goederen-Oei, Best (NL); Thomas J. G. Pelzer, Kerkrade (NL); Martijn M. Hultermans, Eindhoven (NL); Henk A. Dammer, Veldhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 35 days.

(21) Appl. No.: 13/320,033

(22) PCT Filed: May 4, 2010

(86) PCT No.: PCT/IB2010/051941
§ 371 (c)(1),
(2), (4) Date: Nov. 11, 2011

(87) PCT Pub. No.: WO2010/131155
PCT Pub. Date: Nov. 18, 2010

(65) Prior Publication Data
US 2012/0049759 A1    Mar. 1, 2012

(30) Foreign Application Priority Data

May 13, 2009 (EP) .................................... 09160098

(51) Int. Cl.
*H05B 37/02* (2006.01)
*H05B 39/04* (2006.01)
*H05B 41/36* (2006.01)

(52) U.S. Cl.
USPC ............ 315/149; 315/150; 315/152; 315/158

(58) Field of Classification Search
None
See application file for complete search history.

(56) References Cited

U.S. PATENT DOCUMENTS

| | | | |
|---|---|---|---|
| 6,002,389 | A | 12/1999 | Kasser |
| 2007/0230159 | A1 | 10/2007 | Cortenraad et al. |
| 2008/0018615 | A1 | 1/2008 | Zadesky et al. |
| 2008/0018617 | A1 | 1/2008 | Ng et al. |
| 2008/0315798 | A1* | 12/2008 | Diederiks et al. ............. 315/312 |
| 2009/0072765 | A1 | 3/2009 | DeBock |
| 2009/0231167 | A1 | 9/2009 | Chen |

FOREIGN PATENT DOCUMENTS

| | | |
|---|---|---|
| WO | 2006048916 A2 | 5/2006 |
| WO | 2006134529 A2 | 12/2006 |
| WO | 2007033667 A1 | 3/2007 |
| WO | 2007072316 A1 | 6/2007 |
| WO | 2007105134 A1 | 9/2007 |

(Continued)

*Primary Examiner* — Anh Tran
(74) *Attorney, Agent, or Firm* — John Salazar; Mark Beloborodov

(57) ABSTRACT

The present invention relates to a control device adapted to control properties of light emitted from a light source. The control device may comprise a touch-sensitive user interface adapted to visually indicate a range of available values representing at least one of the properties and to enable a user to control the represented property on the basis of a location touched on the touch-sensitive user interface. The controlled property may be adjusted by means of a communication unit adapted to communicate to the light source control signals corresponding to user input. The control device may be adapted to enable the user to control a property associated with an activation area with the user interface upon activation of the activation area by the user.

12 Claims, 4 Drawing Sheets

(56) References Cited

FOREIGN PATENT DOCUMENTS

| WO | 2007105151 A1 | 9/2007 | | |
| WO | WO 2007105151 A1 * | 9/2007 | ............. | H05B 33/08 |
| WO | 2008038179 A2 | 4/2008 | | |
| WO | 2008085418 A2 | 7/2008 | | |
| WO | 2008129485 A1 | 10/2008 | | |

* cited by examiner

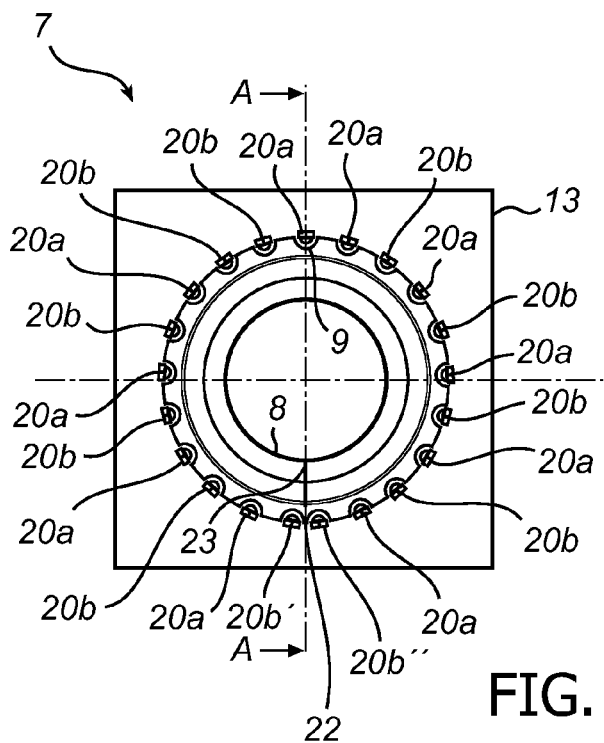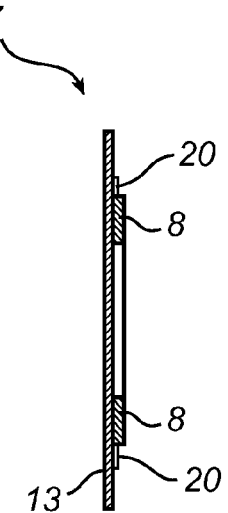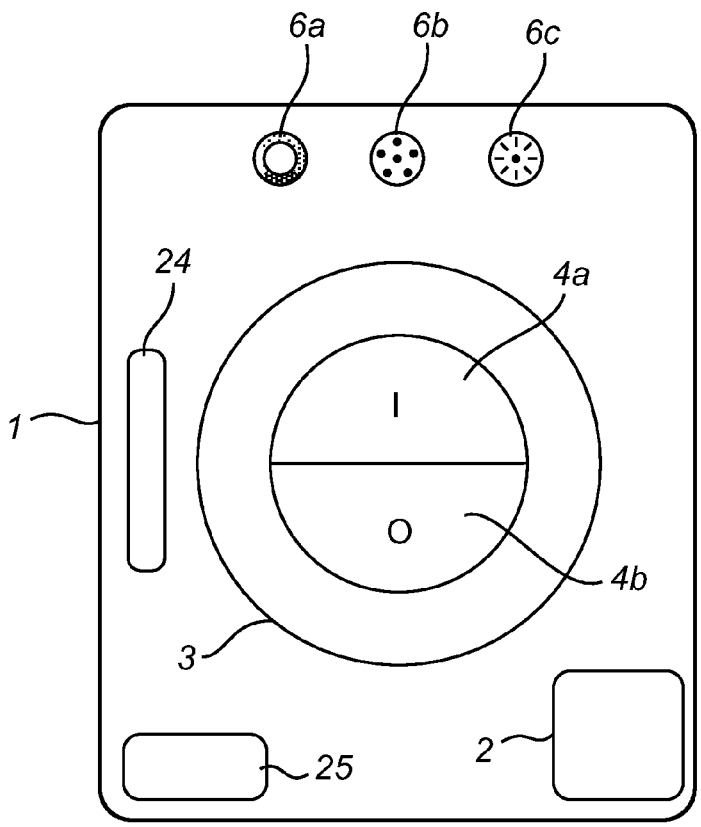
FIG. 4a  FIG. 4b
FIG. 5

USER INTERFACE WITH CIRCULAR LIGHT GUIDED RING WITH ADAPTIVE APPEARANCE DEPENDING ON FUNCTION

FIELD OF THE INVENTION

The present invention generally relates to control of light sources. In particular, the present invention relates to a control device for controlling properties of light emitted from a light source.

BACKGROUND OF THE INVENTION

Light sources are widely used in a wide range of ambient lighting applications for creating a particular lighting atmosphere at various locations such as rooms. Professional indoor lighting applications, aimed at as offices, shops, hotels, etc., are particularly important areas of application.

The use of light-emitting diodes (LEDs) in such light sources becomes increasingly common due to, e.g., their low energy consumption, long lifetime, improved robustness and smaller size compared to traditional light sources, such as filamented light bulbs. Such LEDs are also generally capable of emitting light of various colors, which renders it possible to control the color of the light emitted from a luminaire comprising such LEDs. It is also known to control other properties of emitted light from LEDs, such as brightness and saturation, which may be effectuated in various manners.

Particularly in professional indoor lighting applications, it is in general desirable to be able to control a number of properties of the light emitted from the light source in order to be able to adapt to changing conditions and user needs.

Prior art control devices for controlling properties of light sources used in ambient lighting applications generally enable users to adjust the color, brightness, saturation or intensity of the light emitted from the light sources using color variation means, brightness variation means, saturation variation means or intensity variation means arranged on the devices.

Considering for example a color variation means in accordance with the prior art, such means generally are accompanied by a static printed color wheel (e.g. a circular sticker-type indicator) arranged for indicating an available color variation range for the color of light emitted from the light source upon operation of the color variation means. To make changes in brightness, saturation or intensity, corresponding variation means, similar to the color variation means, are in general provided on the device in addition to the color variation means, as the different properties generally have to be represented in different manners (for example, a static color wheel for representing color variation is not suitable for representing intensity variation). However, for a prior art control device capable of controlling a large number of properties, there will accordingly be required a large number of variation means arranged onto the control device, causing the user to be subjected to numerous possible selections to be made, which may result in confusion and frustration.

According to another prior art example, a variation means may comprise a number of touch or proximity sensitive segments, where segments arranged in a first (radial) direction may be selected to adjust the color of the light emitted from the light source, and segments in a second (circumferential) direction may be selected to adjust the intensity or saturation of the light emitted from the light source. However, such a prior art device may in general be complicated to use and difficult for the user to understand.

There is thus a need in the art for an improved control device that addresses the above problems.

SUMMARY OF THE INVENTION

In view of the above, an object of the present invention is to provide an improved control device for controlling properties of light emitted from a light source.

Another object of the present invention is to provide a control device for controlling properties of light emitted from a light source that reduces the number of possible selections that the user can make, whereby the risk of the user becoming overloaded with too much information at a time may be reduced or eliminated.

Yet another object of the present invention is to provide a control device for controlling properties of light emitted from a light source that is easy to use and understand.

Still another object of the present invention is to provide a proximity sensor to be used in conjunction with such a control device.

One or more of these objects are completely or partially achieved by a control device as defined in the independent claim. Additional embodiments of the present invention are defined in the dependent claims, and further objects of the present invention will become apparent through the following description.

According to a first aspect of the present invention, there is provided a control device adapted to control properties of light emitted from a light source. The control device comprises a touch-sensitive user interface (UI) adapted to visually indicate a range of available values representing at least one property, and to enable a user to control the represented property on the basis of a location touched on the touch-sensitive UI. By the user touching the touch-sensitive UI, the control device is provided with user input. The control device further comprises a communication unit adapted to adjust the controlled property by means of communicating, to the light source, control signals corresponding to the user input. The control device further comprises a plurality of activation areas, wherein each activation area is associated with at least one of the properties and each activation area is adapted, when activated, to cause the control device to enable the user to control the property associated with the activated activation area with the touch-sensitive UI.

Such a control unit may be used to control indoor lighting applications, especially professional indoor lighting applications aimed at shops, offices, hotels, etc. According to the present invention, there is provided a control device for controlling properties of light in various lighting applications that is consistent in behavior and user interaction principles with regards to representing several controllable properties on a single UI. In other words, the control device may comprise a single UI for controlling all of the different controllable properties, where each property is controlled by the user via user input on the UI using the same user interaction principles as for the other properties. Such a control device enables representing one controllable property on the UI at a time, and as a result the number of possible selections that the user can make is reduced, whereby the risk of the user becoming overloaded with too much information at a time may be alleviated or eliminated. By such a control device the user may easily understand what properties the user can control (and what the user cannot control, which is not always the case for prior art control devices). A high user-intuitiveness of the control device may therefore be achieved. Furthermore, as there is no need for including several control or variation means, each for controlling a particular property, the manufacturing costs of the control device may be kept at a relatively low level. Hence, a control device according to the present invention is easy for the user to use and understand, as the different controllable properties may be represented on a single UI in a substantially similar intuitive manner, and furthermore controlled using the same user interaction principles. This decreases the complexity of the control device and increases the user friendliness, and as a result the risk of the user becoming overloaded with too much information at a time may be alleviated or eliminated.

The activation areas of the control device may be configured to be touch-sensitive, or in other words, the activation areas may be configured to be activated by user input without movement of parts or portions in the activation area of the control device, e.g. based on capacitive touch sensing or resistive touch sensing. Alternatively, the activation areas may be configured to be activated by user input by means of a mechanical arrangement such as a hard key or button that may be pressed or depressed by a user, or any other suitable mechanical arrangement adapted to be activated by a user to cause the control device to enable the user to control the property associated with the activated activation area with the touch-sensitive UI. In the following, though an activation area may be referred to specifically as being touch-sensitive, is not meant to limit the activation area to be touch-sensitive but the activation area may alternatively comprise a mechanical arrangement such as described in the foregoing.

In the context of the present invention, by a "user-intuitive" device or element it is meant a device or element that is intuitive, non-complex and straightforward for a user to operate/use.

The user input on the control device by touching the touch-sensitive UI may for example comprise, but is not limited to, the user tap or tapping the touch-sensitive UI, i.e. the user performing a single or repeated touch and release action of e.g. a finger or a stylus on the UI, sliding on the touch-sensitive UI, i.e. the user performing a touch and slide movement of e.g. a finger or stylus on the UI without releasing the finger or stylus from the UI, etc.

The touch-sensitive UI may for example be based on capacitive touch sensing or resistive touch sensing.

According to a second aspect of the present invention, there is provided a proximity sensor adapted to be used in conjunction with a control device according to the first aspect of the present invention or embodiments thereof.

According to an exemplifying embodiment of the present invention, the control device further comprises a UI visual appearance unit adapted to adjust the visual appearance of the UI.

By such a configuration, the visual appearance of the UI may for example be adjusted on the basis of the user's choice of activated property by means of the activation areas, such that the user may provided with visual information that may be used to further facilitate providing indications to the user of what the user can control and of what the user cannot control, as well as how to control the particular property.

According to another exemplifying embodiment of the present invention, each activation area is further configured, when activated, to cause the UI visual appearance variation unit to adapt the visual appearance of the touch-sensitive UI to a particular visual appearance associated with the respective activated property.

By such a configuration, the user may be provided with visual information associated with the currently activated property. This may be used to even further facilitate providing indications to the user what the user can control and what the user cannot control, which in turn leads to an increasingly user-intuitive control device.

According to yet another exemplifying embodiment of the present invention, the UI visual appearance variation unit comprises a light guide and a plurality of light-emitting elements arranged in proximity of said light guide, wherein the UI visual appearance variation unit is adapted such that changes in operation of the light-emitting elements causes changes in the visual appearance of the touch-sensitive UI.

By such a configuration, there is achieved a control device that is relatively inexpensive with regards to manufacturing and flexible with regards to capacity requirements. Furthermore, such a control device provides a flexible and versatile UI visual appearance unit with regards to operation thereof and the manner in which the visual appearance of the touch-sensitive UI may be varied. For example, by such a configuration the touch-sensitive UI may be provided with an adaptive visual appearance having varying colors and/or forming various patterns, such as a picture. The resolution of such a picture is in principle only limited by configuration of the light guide and the number of light-emitting elements (e.g. the number of pixels).

The light-emitting elements described with reference to the different exemplifying embodiments of the present description described herein may comprise, but are not limited to, light-emitting diodes (LEDs), which may be of any type and/or emit light of any color.

According to yet another exemplifying embodiment of the present invention, the light-emitting elements are arranged in a spaced succession forming a continuous loop. In other words, the light-emitting elements are arranged in a spaced succession where a first light-emitting element and a last light-emitting element of the spaced succession are arranged adjacent to each other.

Such a configuration enables representing a property of light emitted by a light source by a continuous loop (e.g. a ring or square shape). Such a representation may be ideal for a property that cannot be represented by a range of values delimited by two extreme values, such as hue. The representation is performed in a manner such that this is clearly communicated to the user. Hence, an even more intuitive UI may be provided, and consequently the user friendliness of the control device may be even further increased.

According to yet another exemplifying embodiment of the present invention, the light guide is substantially circular and approximately planar, and the plurality of light-emitting elements are circumferentially spaced around the light guide and substantially radially oriented with respect to the light guide.

In this way, the light-emitting elements may emit light substantially radially into the light guide. By such a configuration, there is achieved a control device that is flexible and versatile with regards to capacity requirements and/or operation of the touch-sensitive UI.

According to yet another exemplifying embodiment of the present invention, the touch-sensitive UI comprises at least one discontinuity-indicating element adapted to visually indicate a step discontinuity in the range of available values representing the at least one property.

Such a configuration enables implementation a so called "hard transition" in the range of available values representing the currently activated property represented on the UI.

In the context of the present invention, by the term "hard transition" it is meant a portion of the visual appearance of the touch-sensitive UI that indicates to the user the presence of a step discontinuity in the range of available values representing the at least one property, for example between the extreme values in the range of available values representing the at least one the property.

Such a configuration according to the embodiment described immediately above enables representing a property of light emitted by a light source by a representation that may be ideal for a property that can be represented by a range of values delimited by two extreme values, e.g. in the form of a minimum and a maximum value, such as brightness, saturation, color temperature, etc. In this manner, the extreme values, e.g. a minimum and a maximum value, of the available values may be clearly communicated to the user, whereby an even more user-intuitive UI may be provided, and consequently the user friendliness of the control device may be further increased.

A discontinuity-forming element such as described with reference to some of the different exemplifying embodiments of the present description described herein may comprise, but are not limited to, a slit, a hole or a light-blocking structure arranged in the light guide or a colored region arranged on the light guide.

According to yet another exemplifying embodiment of the present invention, at least two adjacent light-emitting elements are arranged such that the spacing between the two adjacent light-emitting elements is less than the spacing between other adjacent light-emitting elements of the plurality of light-emitting elements.

By such a configuration, there is enabled a relatively easily implemented manner for e.g., increasing the visual contrast at a hard transition in a range of values indicated on the UI.

According to yet another exemplifying embodiment of the present invention, the touch-sensitive UI is further adapted to visually indicate a subrange of the range of available values representing the at least one property.

Such a configuration for example enables a user to "zoom in" on the range of available values representing the at least one property, or in other words, to visually focus on a subrange of the range of available values representing the at least one property, thereby enabling the user to tune the property more finely, e.g. by enabling the user to adjust, by the user input on the UI, the represented property in finer increments (i.e. finetuning the represented property). Such a configuration may be especially advantageous for controlling, e.g., the hue of light emitted by the light source.

According to yet another exemplifying embodiment of the present invention, the control device further comprises a memory unit adapted to store data, wherein the touch-sensitive UI is further adapted to enable a user to select one or more preset values previously stored on the memory unit, where the preset values represent predetermined settings of one or more of the properties.

A configuration according to the embodiment described immediately above enables the user to store preset values for the properties, which preset values may be retrieved even after the control device and/or the light source has been powered off and subsequently been powered on, consequently increasing the versatility of the control device with regards to operation.

The memory unit may comprise a non-volatile memory such as a read-only memory (ROM) or a flash memory.

According to yet another exemplifying embodiment of the present invention, the control device may further comprise a proximity sensor adapted to sense proximity of an object within a predetermined distance from the control device.

Alternatively or optionally, the proximity sensor may be adapted to sense proximity of an object within a predetermined distance from an activation area of the plurality of activation areas and/or within a predetermined distance from the touch-sensitive UI.

Such configurations enable the control device going from an idle mode (powersaving) to an active mode (ready for user input) when an object within a certain proximity is sensed and/or enable the control device to switch to an idle mode if no object within a certain proximity is sensed. This may be effectuated by the proximity sensor, or another suitable component, actuated by the proximity sensor. Thus, the energy consumption of the control device may be reduced inbetween periods of ordinary use of the control device (when the control device is in an active state). When proximity is detected, the activation (comprising power-on, calibration, etc.) of the components of the control device may be initiated. The proximity sensor may be adapted to sense proximity of the object with a predetermined sensing rate. The proximity sensor may for example be based on capacitive touch sensing or resistive touch sensing.

Alternatively or optionally, the proximity sensor may be adapted, when proximity of an object within a predetermined distance is sensed such as described in the foregoing, to provide backlighting of the currently activated activation area, e.g. by means of a backlight unit. The proximity sensor may be adapted to provide backlighting of the currently activated activation area having a first luminous flux and provide backlighting of the other activation areas having a second luminous flux that is lower than the first luminous flux. For example, the difference between the first luminous flux and the second luminous flux may be such that the difference is clearly detectable by a naked eye (e.g. by a user).

In the context of the present invention, by "backlighting" of a component it is meant illumination from the side or the back of the component, the front of the component being intended to be viewed by the user.

In addition to power saving, such configurations may be used to provide the user with a visual signal (e.g. by lighting up the UI) at the activation of the control device indicating to the user that the control device is ready for use.

According to yet another exemplifying embodiment of the present invention, the control device is adapted in such a way that the properties may comprise any of the properties of light selected from the group of hue, saturation, brightness, color temperature and timing properties. This list is not meant to be exhaustive. Instead, the present invention encompasses embodiments wherein the control device may be adapted in such a way that it is capable of controlling properties of light emitted from the light source other than the exemplifying properties listed above.

In the context of the present invention, by "timing properties" it is meant for example the length of time periods during which light is on/off, the length of time periods after which light are to be switched on/off or dimmed, etc.

Further objects and advantages of the present invention will be described below by means of exemplifying embodiments.

BRIEF DESCRIPTION OF THE DRAWINGS

Exemplifying embodiments of the invention will be described below with reference to the accompanying drawings, in which:

FIGS. 4A-4B are schematic view of touch-sensitive user interfaces according to exemplifying embodiments of the present invention; and FIG. 5 is a schematic view of another exemplifying embodiment of the present invention.

In the accompanying drawings, the same reference numerals denote the same or similar elements throughout the views.

DETAILED DESCRIPTION

The following is a description of exemplifying embodiments in accordance with the present invention. It is to be understood that the following description is non-limiting and for the purpose of describing the principles of the invention.

Figure 1A:
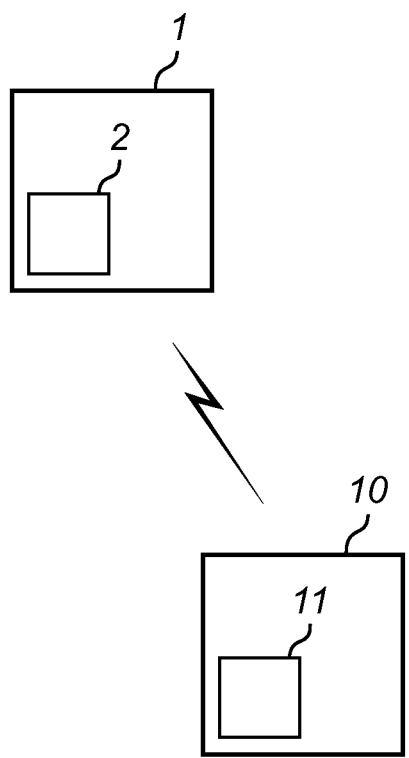
FIGS. 1A-1B are schematic block diagrams of exemplifying embodiments of the present invention.

Referring to FIG. 1A, there is shown a schematic block diagram of a control device 1 according to an exemplifying embodiment of the present invention. The control device 1 may comprise a communication unit 2 adapted to communicate control signals, corresponding to user input on the control device 1, via wireless communications to a light source 10. The light source 10 may in turn comprise a communication unit 11 adapted to receive control signals communicated from the communication unit 2 of the control device 1, on the basis of which control signals properties of light emitted from the light source 10 may be adjusted.

Figure 1B:
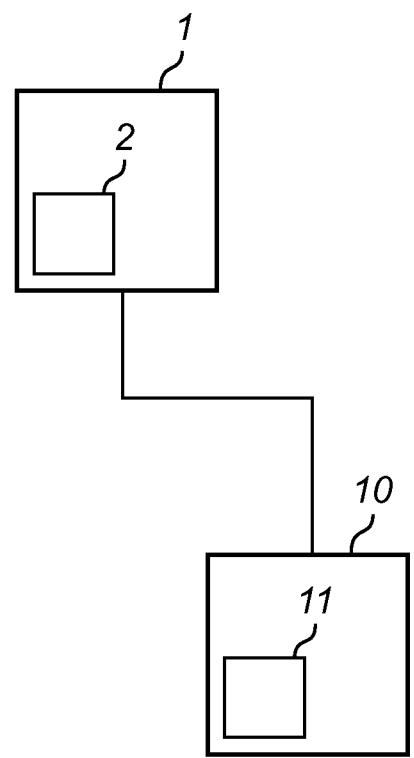

Referring now to FIG. 1B, there is shown a schematic block diagram of a control device 1 according to another exemplifying embodiment of the present invention. The control device 1 may comprise a communication unit 2 adapted to communicate control signals, corresponding to user input on the control device 1, via communication wires to a light source 10. The light source 10 may in turn comprise a communication unit 11 adapted to receive control signals communicated from the communication unit 2 of the control device 1, on the basis of which control signals properties of light emitted from the light source 10 may be adjusted.

Thus, with reference to FIGS. 1A-1B, the communication unit 2 of the control device 1 may be adapted to communicate control signals to the light source 10 (or to the communication unit 11 of the light source 10) in a wired fashion (e.g. by means of Ethernet, lighting control systems such as Digital Addressable Lighting Interface (DALI), DMX (such as DMX512), etc.) or in a non-wired fashion (e.g. by means of wireless infra-red (IR) communications or other wireless optical communications, or by means of wireless radiowave communications). As such techniques are known in the art and furthermore are not critical to the implementation of the present invention as such, detailed description thereof is omitted. The control device 1 may also be implemented in a docking station (not shown) integrated with or external to the light source 10, comprising e.g. a luminaire, that the control device 1 is intended to control. On one hand, the communication unit 2 may in such a case communicate control signals to the light source 10 via the docking station when the control device 1 is docked in the docking station. On the other hand, when the control device 1 is not docked in the docking station, the communication unit 2 may for example communicate control signals to the light source 10 (or to the communication unit 11 of the light source 10) in a wired or non-wired fashion such as has been described in the foregoing.

Figure 2:
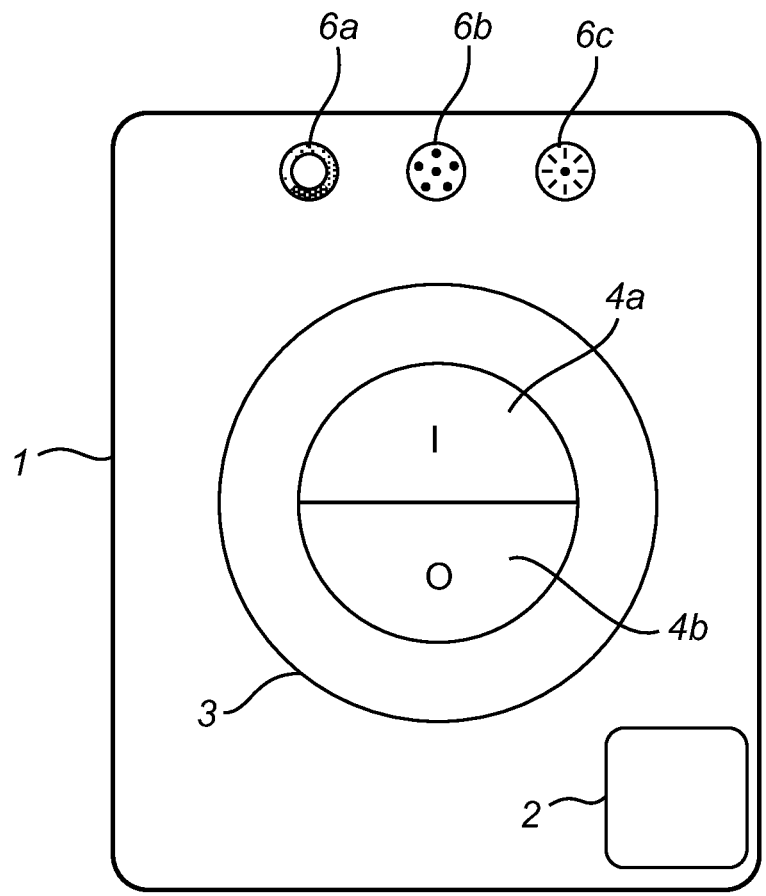
FIG. 2 is a schematic view of another exemplifying embodiment of the present invention.

Referring to FIG. 2, there is shown a schematic view of a control device 1 according to an exemplifying embodiment of the present invention, the control device 1 being adapted to control properties of light emitted from a light source 10. The control device 1 comprises a touch-sensitive user interface (UI) 3. According to the depicted embodiment, the UI 3 comprises a ring-shaped panel sensitive to touch by a user, whereby the control device 1 is provided with user input. The touch-sensitive UI 3 is adapted to visually indicate a range of available values representing at least one property of the light emitted by the light source 10 and to enable a user to control the represented property on the basis of a location touched on the UI 3. The control device 1 further comprises a communication unit 2 adapted to adjust the controlled property by means of communicating, to the light source 10, control signals corresponding to the user input. Though the UI 3 described with reference to FIG. 2 comprises a ring-shaped panel, the UI 3 may comprise shapes other than such a ring-formed shape while completely or partially achieving the advantages of the present invention. This is further described in the following.

The control device may further comprise an on button 4a and an off button 4b for powering up and powering down the control device 1, respectively. The control device 1 may also comprise a front housing 5, which in turn may comprise the UI 3, in accordance with the illustrated embodiment, for enabling interaction with a user.

With further reference to FIG. 2, the control device 1 may further comprise a plurality of touch-sensitive activation areas 6a, 6b, 6c. Each touch-sensitive activation area 6a, 6b, 6c may be associated with at least one of the properties of light emitted from the light source 10, e.g. hue, saturation, brightness, color temperature and timing properties, and each touch-sensitive activation area 6a, 6b, 6c may be adapted, when activated, to cause the control device 1 to enable the user to control the property associated with the respective activated touch-sensitive activation area 6a, 6b, 6c via the touch-sensitive UI 3.

Figure 3:
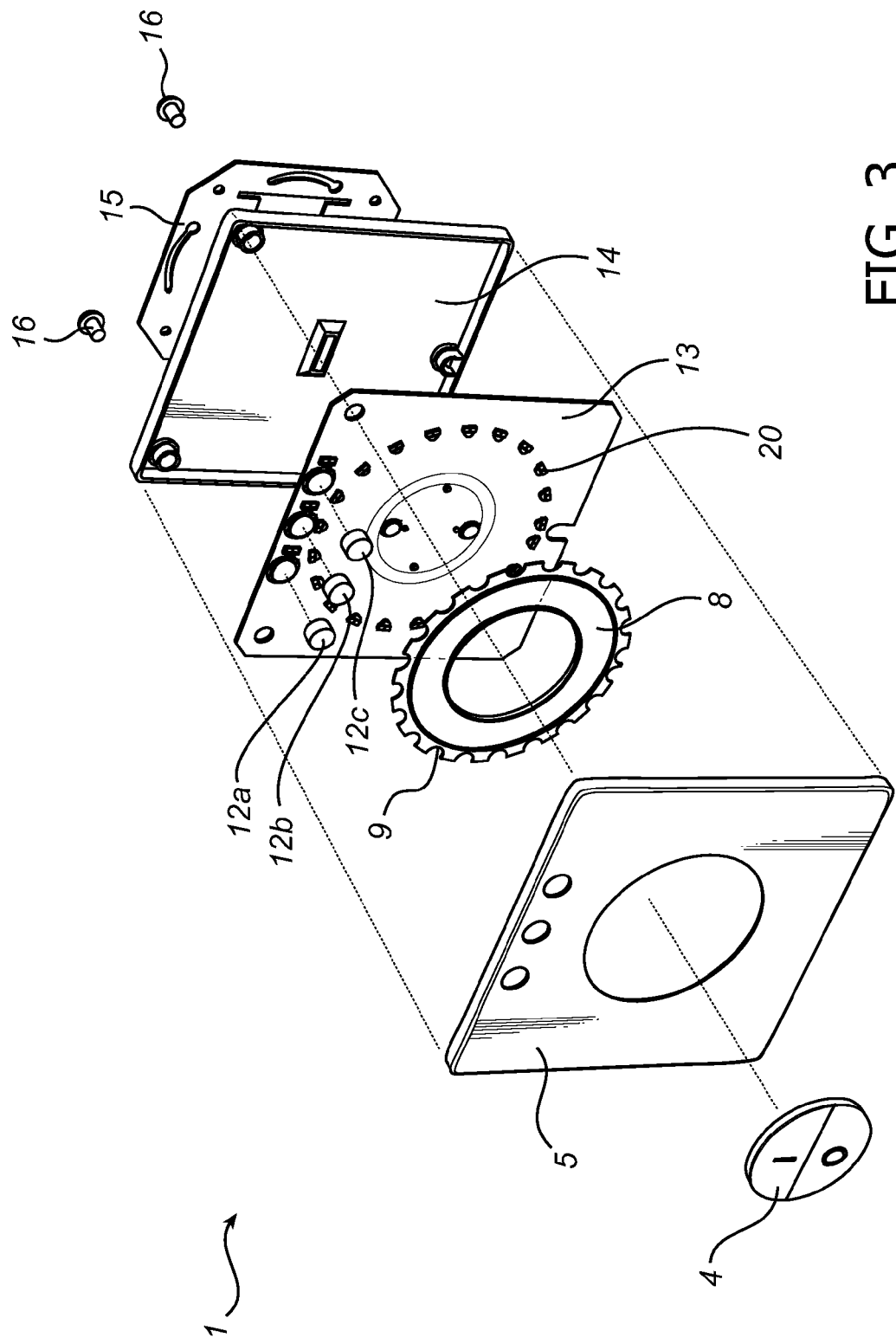
FIG. 3 is a schematic exploded view of components of a control device according to an exemplifying embodiment of the present invention.

Referring now to FIG. 3, there is shown a schematic exploded view of a control device 1 according to an exemplifying embodiment of the present invention. The depicted control device 1 comprises an activation/deactivation portion 4 for activation/deactivation of the control device 1. With reference to FIG. 2, the activation/deactivation portion 4 may comprise an on button 4a and an off button 4b for powering on and off the control device 1, respectively. Referring further to FIG. 3, the control device 1 may further comprise a front housing 5 and a back housing 14. The front housing 5 and the back housing 14 are adapted such that when they are assembled together, they may accommodate and protect other components of the control device 1. The control device 1 may further comprise a light guide 8. According to the illustrated embodiment, the light guide 8 may be substantially circular and approximately planar and comprise a plurality of circumferentially spaced notches 9 (or recesses), each notch 9 (only one notch 9 being referenced by the numeral 9) being arranged to be capable of receiving a light-emitting element 20 that, when received in the respective notch 9, may be substantially radially oriented with respect to the light guide 8. Such light-emitting elements 20 may for example comprise light-emitting diodes (LEDs) of different colors and/or type.

With reference to FIGS. 2 and 3, the touch-sensitive UI 3 may be implemented by means of the light guide 8 arranged on a printed circuit board (PCB) 13 provided with touch-sensitive means (not shown). For example, the touch-sensitive means may be based on capacitive touch sensing or resistive touch sensing. As such techniques are known in the art and furthermore are not critical to the implementation of the present invention as such, detailed description thereof is omitted. When the light guide 8 is arranged on the PCB 13, light-emitting elements 20 (only one light-emitting element 20 is referenced by the numeral 20) may be arranged in the respective notches 9 such that the light-emitting elements 20 may emit light radially into the light guide 8. In this way, light from the radially-emitting elements 20a, 20b may be mixed in the light guide 8 in such a way as to visually indicate a range of available values representing the at least property represented on the UI 3. Hence, changes in operation of the light-emitting elements 20 may be utilized to cause changes in the visual appearance of the touch-sensitive UI 3, which according to the illustrated embodiment is implemented by means of the light guide 8. In this manner, the light guide 8 and the light-emitting elements 20 comprise a UI visual appearance variation unit (further described with reference to FIGS. 4A-4B in the following). The PCB 13 may be mounted on the back housing 14 using suitable fixation means as known in the art. For providing power to the light-emitting elements 20 the PCB 13 may further comprise a power source (not shown) adapted to supply power to the light-emitting elements 20, e.g. a battery, as well known in the art.

With reference to FIG. 3, the control device 1 may further comprise activation areas (cf. FIG. 2) implemented as buttons 12a, 12b, 12c that may be mounted on the PCB 13. As illustrated in FIG. 3, the front housing 5 may comprise cut-out portions for at least partly accommodating the light guide 8 and the buttons 12a, 12b, 12c.

Further referring to FIG. 3, the control device 1 may be adapted to be mounted on a wall or the like within or in proximity of the lighting environment that the control device 1 is intended to be able to control. For this purpose, as illustrated in FIG. 3, a mounting plate 15 may be provided for releasable mounting of the control device 1 by means of suitable mounting means, such as pegs or screws 16, etc.

Referring now to FIGS. 4A and 4B, there is shown in FIG. 4A a schematic view of a UI visual appearance variation unit 7 according to an exemplifying embodiment of the present invention. FIG. 4B is a side view of the UI visual appearance unit 7 depicted in FIG. 4A along the section A-A.

With reference to FIGS. 2 and 3, the control device 1 may further comprise a UI visual appearance variation unit 7 adapted to adjust the visual appearance of the UI 3. Each touch-sensitive activation area 6a, 6b, 6c may be further configured, when activated, to cause the UI visual appearance variation unit 7 to adapt the visual appearance of the touch-sensitive UI 3 to a particular visual appearance associated with the respective activated property.

Referring to FIG. 4A, the UI visual appearance unit 7 may comprise a substantially circular and approximately planar light guide 8 arranged on a PCB 13 (of which only a portion is shown). The UI visual appearance unit 7 may further comprise a plurality of circumferentially spaced notches 9 (or recesses), each notch 9 (only one notch 9 being referenced by the numeral 9 in FIG. 4A) being arranged to be capable of receiving a light-emitting element 20a, 20b that, when received in the respective notch 9, may be substantially radially oriented with respect to the light guide 8. According to the exemplifying illustrated embodiment, the light-emitting elements 20a, 20b comprise LEDs 20a capable of emitting white light and LEDs 20b capable of emitting RGB light, the light-emitting elements 20a, 20b being arranged substantially in a periodic succession of white and RGB LEDs 20a, 20b. However, such a periodic succession is only shown by way of example and other configurations of white LEDs and RBG LEDs, or RGB LEDs only, etc. may be implemented according to user needs and/or application requirements.

According to the exemplifying illustrated embodiment, the light-emitting elements 20a, 20b are circumferentially spaced around the light guide 8 with a spacing that is substantially constant. It is emphasized that FIG. 4a is schematic and the present invention encompasses embodiments comprising arbitrary distances between the circumferentially spaced light-emitting elements 20a, 20b.

The distances between the circumferentially spaced light-emitting elements 20a, 20b need not be the same all around the light guide 8. On the contrary, at least two adjacent light-emitting elements 20b', 20b" may be arranged such that the spacing between the two adjacent light-emitting elements 20b', 20b" is less than the spacing between other adjacent light-emitting elements of the plurality of light-emitting elements. Such a configuration is shown at the bottom of the light guide 8 in FIG. 4A. This may be utilized for increasing the visual contrast at a hard transition, as has been previously discussed.

According to the illustrated embodiment in FIG. 4A, such a hard transition may be implemented by means of a discontinuity-forming element 23 arranged in the light guide 8. Hence, the UI 3 may further comprise a discontinuity-indicating element 23 adapted to visually indicate a step discontinuity in the range of available values representing the at least one property, thus implementing such a hard transition in the range of available values representing the currently activated property represented on the UI 3. For implementation of such a discontinuity-indicating element 23 there may be arranged a colored region, for example a line 23 according to the illustrated embodiment, in the light guide 8.

The light guide 8 may further comprise a light blocking structure 22, or barrier, between or otherwise being in proximity of a pair of adjacent light-emitting elements 20b', 20b" as described in the paragraph immediately above, the light-blocking structure 22 being adapted to substantially block light emitted by light-emitting elements, for further controlling the visual characteristics in proximity of the hard transition.

FIG. 4B is a side view along the section A-A of the UI visual appearance unit 7 described with reference to FIG. 4A, comprising light-emitting elements 20 that may comprise LEDs capable of emitting light of varying color substantially radially into the light guide 8.

Though the embodiments of the present invention described with reference to FIGS. 3, 4A and 4B comprise a light guide 8 having a generally ring-formed shape, the light guide 8 may also be configured such that it has other shapes, e.g. a square shape. The light-emitting elements 20, 20a, 20b may then be arranged in a spaced succession forming a continuous loop such as to enable them to emit light into the light guide 8, which light may be mixed in the light guide 8 in such a way as to visually indicate a range of available values representing the at least property represented on the UI 3. In this way, changes in operation of the light-emitting elements 20, 20a, 20b may be utilized to cause changes in the visual appearance of the touch-sensitive UI 3.

Referring now to FIG. 5, there is shown a schematic view of a control device 1 according to an exemplifying embodiment of the present invention. The control device 1 depicted in FIG. 5 comprises components similar to or the same as components comprised in the control device described with reference to FIG. 2. The description of such similar or identical components with reference to FIG. 5 is therefore omitted.

With reference to FIG. 5, in contrast to the control device 1 described with reference to FIG. 2, the control device 1 comprises a memory unit 24 adapted to store data. The touch-sensitive UI 3 may be adapted to enable a user to select one or more preset values previously stored on the memory unit 24. Such preset values may represent predetermined settings of one or more properties. In this way, the user may store preset values for the properties, which preset values may be retrieved (by the user) even after the control device and/or the light source has been powered off and subsequently been powered on. The memory unit 24 may comprise a non-volatile memory such as a read-only memory (ROM) or a flash memory.

With further reference to FIG. 5, in contrast to the control device 1 described with reference to FIG. 2, the control device 1 comprises a proximity sensor 25 adapted to sense proximity of an object, such as a finger of a user or a stylus, within a predetermined distance from the control device 1. Alternatively or optionally, the proximity sensor 25 may be adapted to sense proximity of an object within a predetermined distance from a touch-sensitive activation area 6a, 6b, 6c and/or within a predetermined distance from the touch-sensitive UI 3. Such a proximity sensor 25 enables the control device 1 to go from an idle (powersaving) mode to an active mode (ready for user input) when an object within a certain proximity is sensed and/or enables the control device 1 to switch to an idle mode if no object within a certain proximity is sensed. This may be effectuated by the proximity sensor 25 itself, or another suitable component, actuated by the proximity sensor 25. Thus, the energy consumption of the control device 1 may be reduced inbetween periods of ordinary use of the control device 1 (when the control device 1 is in an active state). When proximity is detected, the activation (comprising power-on, calibration, etc.) of the components of the control device 1 may be initiated. The proximity sensor 25 may be adapted to sense proximity of the object at regular intervals. Such a proximity sensor 25 may for example be based on capacitive touch sensing or resistive touch sensing. As such techniques are known in the art and furthermore are not critical to the implementation of the present invention as such, detailed description thereof is omitted.

A memory unit 24 and/or proximity sensor 25 as have been described with reference to FIG. 5 are optional.

In conclusion, the present invention relates to a control device adapted to control properties of light emitted from a light source. The control device may comprise a touch-sensitive user interface adapted to visually indicate a range of available values representing at least one of the properties and to enable a user to control the represented property on the basis of a location touched on the touch-sensitive user interface. The controlled property may be adjusted by means of a communication unit adapted to communicate to the light source control signals corresponding to user input. The control device may be adapted to enable the user to control a property associated with an activation area with the user interface upon activation of the activation area by the user.

Although exemplary embodiments of the present invention has been described herein, it should be apparent to those having ordinary skill in the art that a number of changes, modifications or alterations to the invention as described herein may be made. Thus, the above description of the invention and the accompanying drawings are to be regarded as non-limiting examples of the invention and the scope of protection is defined by the appended claims.

The invention claimed is:

1. A control device for controlling a plurality of properties of light emitted from a light source, the device comprising:
   a touch-sensitive user interface, for visually indicating a range of available values representing at least one property and to enable a user to control said at least one property on the basis of a location touched on said touch-sensitive user interface, thereby providing the control device with user input;
   a communication unit for adjusting said at least one property by means of communicating, to the light source, control signals corresponding to said user input;
   a plurality of activation areas, each activation area being associated with at least one of said plurality of properties and being adapted, when activated, to cause said control device to enable the user to control the property associated with said activated activation area with said touch-sensitive user interface;
   a user interface visual appearance variation unit adapted to adjust the visual appearance of the user interface on the basis of the respective property associated with the activation area which includes a substantially circular and approximately planar light guide having a plurality of recesses, each of the recesses arranged to receive a light emitting element.

2. The control device according to claim 1, wherein each activation area is further configured, when activated, to cause said user interface visual appearance variation unit to adapt the visual appearance of said touch-sensitive user interface to a particular visual appearance associated with the respective activated property.

3. The control device according to claim 1, wherein said user interface visual appearance variation unit comprises the light guide and the plurality of light-emitting elements arranged in proximity of said light guide, the user interface visual appearance variation unit being adapted such that changes in operation of the light-emitting elements causes changes in the visual appearance of said touch-sensitive user interface.

4. The control device according to claim 3, wherein said light-emitting elements are arranged in a spaced succession forming a continuous loop.

5. The control device according to claim 3, and wherein said plurality of light-emitting elements are circumferentially spaced around said light guide and substantially radially oriented with respect to the light guide.

6. The control device according to claim 3, wherein at least two adjacent light-emitting elements are arranged such that the spacing between said two adjacent light-emitting elements is less than the spacing between other adjacent light-emitting elements of said plurality of light-emitting elements.

7. The control device according to claim 1, wherein said touch-sensitive user interface comprises at least one discontinuity-indicating element adapted to visually indicate a step discontinuity in said range of available values representing said at one property.

8. The control device according to claim 1, wherein said touch-sensitive user interface is configured to visually indicate a subrange of said range of available values representing said at least one property.

9. The control device according to claim 1, further comprising a memory unit adapted to store data, wherein said touch-sensitive user interface is further adapted to enable a user to select one or more preset values previously stored on said memory unit, the preset values representing predetermined settings of one or more of said properties.

10. The control device according to claim 1, further comprising a proximity sensor adapted to sense proximity of an object within a predetermined distance from said control device.

11. The control device according to claim 1, wherein said plurality of properties comprise any of the properties of light selected from the group consisting of: hue, saturation, brightness, color temperature and timing.

12. A control device to control properties of light emitting from a light source, comprising:
- a touch sensitive user interface operable to visually indicate a range of available values representing a plurality of properties and enable a user to control each of the plurality of properties on the basis of a location touched on the touch sensitive user interface;
- a control unit for adjusting each of the plurality of properties and operably connected to the light source by transmitting control signals to the light source corresponding to the location touched on the touch sensitive user interface representing user input;
- a light guide forming at least a part of the touch sensitive user interface operably connected to a printed circuit board and positioned relative to a plurality of light emitting elements, each of the light emitting elements positioned in one of a plurality of recesses formed in the light guide such that each of the light emitting elements emit light radially into the light guide to visually indicate a range of available values representing a selected one of the plurality of properties;
- wherein spacing between adjacent light emitting elements is less than spacing between other light emitting elements to indicate the visual contrast at a hard transition of the selected one of the plurality of properties.

* * * * *